(12) United States Patent
Lee

(10) Patent No.: US 6,480,434 B1
(45) Date of Patent: Nov. 12, 2002

(54) MEMORY DEVICE WITH PRECHARGE REINFORCEMENT CIRCUIT

(75) Inventor: Ihl-Ho Lee, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/029,937

(22) Filed: Dec. 31, 2001

(30) Foreign Application Priority Data

Sep. 18, 2001 (KR) .......................................... 2001-57691

(51) Int. Cl.[7] .................................................. G11C 7/00
(52) U.S. Cl. ........................ 365/203; 365/204; 365/205
(58) Field of Search ................................ 365/203, 205, 365/207, 230.03, 204

(56) References Cited

U.S. PATENT DOCUMENTS

| | | |
|---|---|---|
| 4,967,395 A | 10/1990 | Watanabe et al. |
| 5,255,231 A | 10/1993 | Oh |
| 5,276,641 A | 1/1994 | Sprogis et al. |
| 5,629,887 A | 5/1997 | Nakano et al. |
| 5,973,976 A | 10/1999 | Sato |
| 6,104,653 A | 8/2000 | Proebsting |
| 6,163,475 A | 12/2000 | Proebsting |
| 6,163,498 A | 12/2000 | Moon |

FOREIGN PATENT DOCUMENTS

| | | | |
|---|---|---|---|
| JP | 63-249997 | 10/1988 | ........... G11C/11/34 |
| JP | 01-173390 | 7/1989 | ........... G11C/11/34 |
| JP | 02-050393 | 2/1990 | ......... G11C/11/409 |
| JP | 02-143982 | 6/1990 | ......... G11C/11/401 |
| JP | 04-184787 | 7/1992 | ......... G11C/11/409 |
| JP | 10-214485 | 8/1998 | ......... G11C/11/409 |
| JP | 00-000492 | 1/2000 | ............. B04B/7/02 |

*Primary Examiner*—Viet Q. Nguyen
*Assistant Examiner*—Hien Nguyen
(74) *Attorney, Agent, or Firm*—Jacobson Holman PLLC

(57) ABSTRACT

A memory device includes: a plurality of cell array blocks provided with a plurality of memory cells coupled to a word line and a bit line pair; a bit line control block including a first control block and a second control block, wherein the first control block is separately coupled to a first bit line pair coupled to a first cell array block among the cell array blocks, and the second control block is shared with a second bit line pair commonly coupled to the first cell array block and a second cell array block adjacent to the first cell array block; and a precharge reinforcement unit, coupled to a predetermined portion of the first control block, for reducing a precharge speed difference between the first bit line pair and the second bit line pair.

13 Claims, 9 Drawing Sheets

MEMORY DEVICE WITH PRECHARGE REINFORCEMENT CIRCUIT

FIELD OF THE INVENTION

The present invention relates to a memory device; and, more particularly, to a memory device capable of improving a characteristic of a bit line precharge time tRP.

DESCRIPTION OF THE PRIOR ART

In general, a dynamic random access memory (DRAM), one type of semiconductor memory device, selects a specific memory cell through a row decoder, and writes/reads data to/from the selected specific memory cell through bit lines. A bit line sense amplifier (BLSA) coupled to the bit lines amplifies the data.

Figure 1:
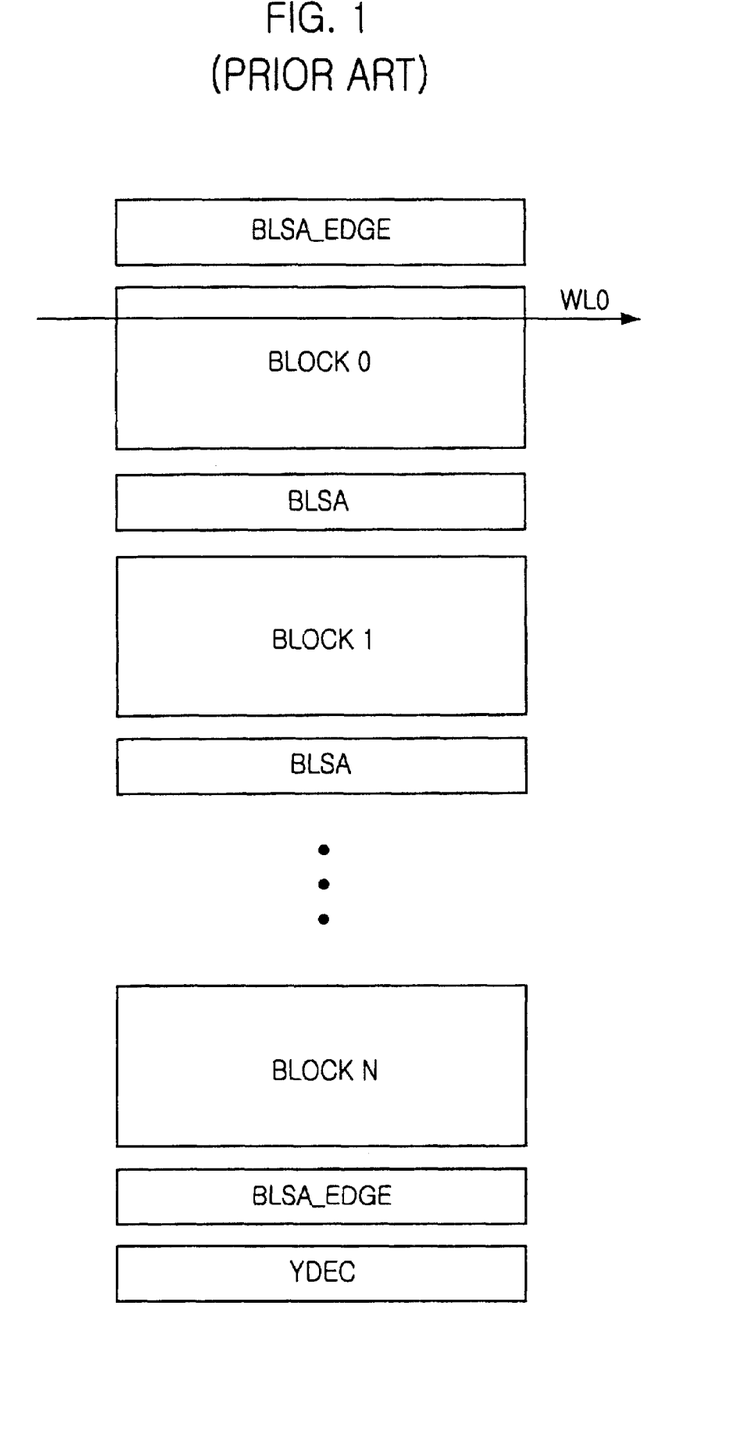
FIG. 1 is a block diagram showing the structure of a conventional memory cell array block and bit line sense amplifier block (BLSA)

FIG. 1 is a block diagram showing the structure of a conventional semiconductor memory device having a bit line sense amplifier. One cell array block shares two bit line sense amplifiers.

Referring to FIG. 1, a plurality of cell array blocks BLOCK0 to BLOCKN are shared by one column decoder YDEC, and each cell array block is shared by two bit line sense amplifiers BLSA.

Here, the cell array blocks BLOCK0 to BLOCKN are arrayed at positions corresponding to a word line (WL) and a bit line (BL), and are constituted by a cell array having a plurality of memory cells for storing the data. The bit line sense amplifier BLSA includes edge bit line sense amplifiers BLSA_EDGE and central bit line sense amplifiers BLSA. The edge bit line sense amplifiers BLSA_EDGE are disposed at the highest cell array block BLOCK0 and the lowest cell array block BLOCKN, and the central bit line sense amplifiers BLSA are disposed between the cell array blocks.

In other words, while the central bit line sense amplifiers BLSA are disposed between the cell array blocks, the edge bit line sense amplifiers BLSA_EDGE are coupled only to the highest cell array block BLOCK0 and the lowest cell array block BLOCKN in which there is no cell at one side thereof.

Figure 2:
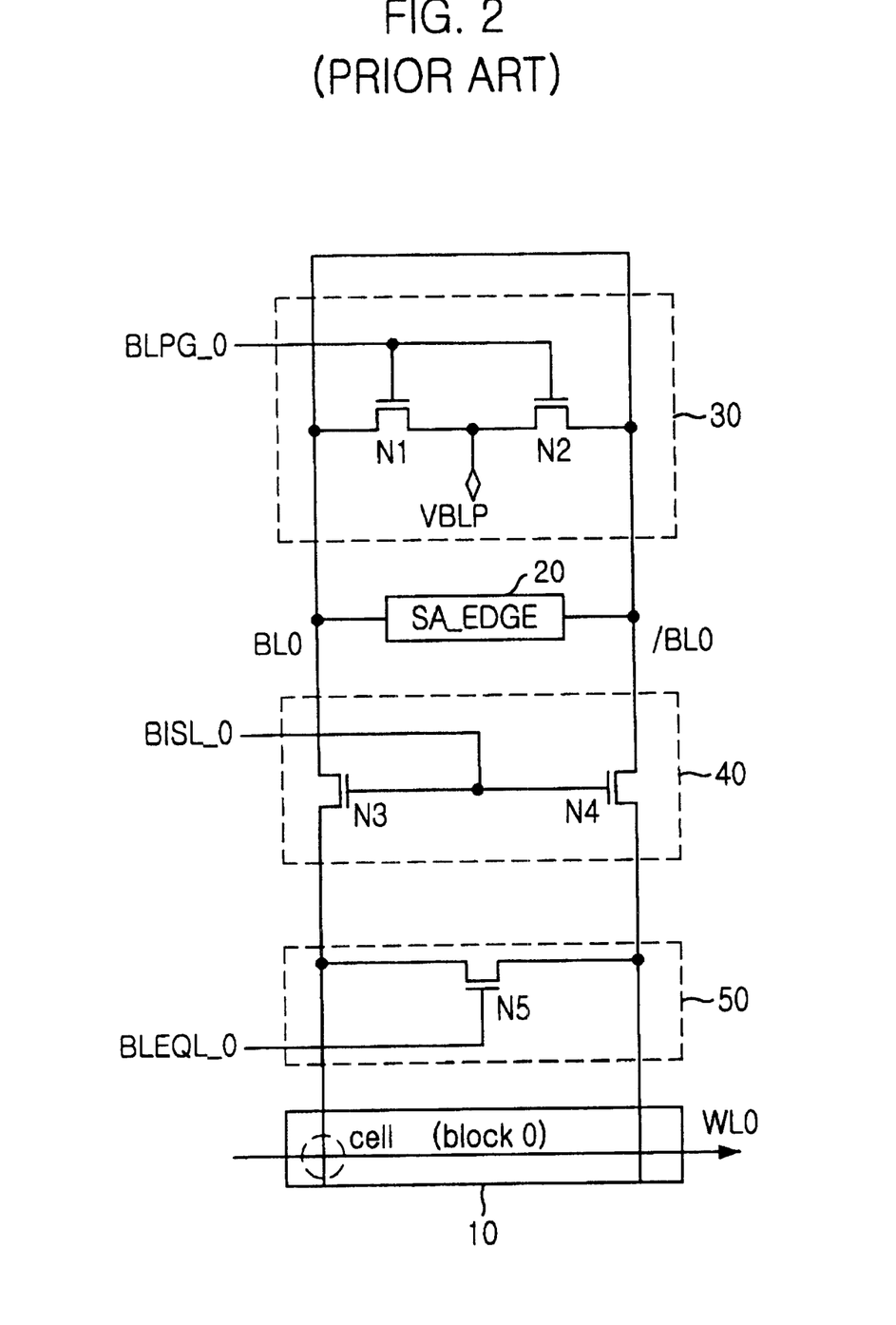
FIG. 2 is a circuit diagram showing a conventional edge cell array block and first control block.

FIG. 2 is a circuit diagram showing the edge bit line sense amplifier BLSA_EDGE, a bit line control block containing peripheral circuits, and a cell array block according to the prior art. In the case where bit lines BL0 and /BL0 are precharged after the activation of word line WL0 of the top cell array block BLOCK0, the operation of the bit line sense amplifier will be described with reference to FIG. 2.

Referring to FIG. 2, the conventional edge bit line sense amplifier and control circuits include a cell array block 10, a sense amplifier 20, a precharge unit 30, a block selection unit 40 and an equalization unit 50.

The cell array block 10 is arrayed at a position corresponding to a word line WL0 and a bit line pair BL0 and /BL0, and is provided with a plurality of memory cell arrays for storing the cell data. The sense amplifier 20 senses and amplifies the cell data through the bit line pair BL0 and /BL0 coupled to the cell array block 10.

The precharge unit 30 precharges the bit line pair BL and /BL0 to a predetermined potential level in response to a bit line precharge control signal BLPG_0. The block selection unit 40 controls the connection between the block 10 and the sense amplifier 20 through the bit line pair BL0 and /BL0 in response to a bit line isolation signal BISL_0.

The equalization unit 50 is coupled between the block selection unit 40 and the cell array block 10, and directly equalizes the bit line pair BL0 and /BL0 in response to a bit line equalization signal BLEQL_0.

Here, the precharge unit 30 includes a bit line precharge voltage applying terminal VBLP, a first NMOS transistor N1 and a second NMOS transistor N2. A predetermined potential level, generally half the power supply voltage level (that is, Vcc/2), is applied to the bit line precharge voltage applying terminal VBLP. The bit line precharge control signal BLPG_0 is commonly applied to each gate of the first and the second NMOS transistors N1 and N2.

The block selection unit 40 includes a third NMOS transistor N3 and a fourth NMOS transistor N4, which are coupled to the bit line pair BL0 and /BL0, respectively. The bit line isolation signal BISL_0 is commonly applied to each gate of the third and the fourth NMOS transistors N3 and N4.

The equalization unit 50 includes a fifth NMOS transistor N5 having a gate receiving the bit line equalization signal BLEQL_0, and a source and a drain coupled between the bit line pair BL0 and /BL0.

Meanwhile, the bit line precharge control signal BLPG_0 is a signal that is activated when the bit line pair BL0 and /BL0 are precharged. That is, the bit line precharge control signal BLPG_0 is enabled from a low level to a high level when the bit line pair BL0 and /BL0 are precharged.

The bit line isolation signal BISL0 is a signal that is activated to a high level in order to select a lower cell array block among a plurality of blocks. That is, the bit line isolation signal BISL_0 maintains a predetermined level Vpp higher than the power supply voltage level Vcc at the activation operation and is set to the power supply voltage level Vcc in the precharge operation.

The bit line equalization signal BLEQL_0 is a signal that is activated in order to equalize the bit lines to a predetermined potential level. That is, the bit line equalization signal BLEQL_0 is enabled from a low level to a high level at the precharge operation of the bit line pair BL0 and /BL0.

Referring to FIG. 2, the bit line precharge control signal BLPG_0 is enabled from the low level to the high level at the precharge operation of the bit lines, so that the first and the second NMOS transistors N1 and N2 are turned on. In response to the first and the second NMOS transistors N1 and N2 being turned on, the bit line pair BL0 and /BL0 are set to the bit line precharge voltage (VBLP) level, which is typically half the power supply voltage level Vcc.

At this time, the bit line isolation signal BISL_0 maintains the predetermined level Vpp higher than the power supply voltage level Vcc at the activation operation of the bit lines and is set to the power supply voltage level Vcc in the precharge operation thereof, so that the third and the fourth NMOS transistors N3 and N4 are maintained at a turned-on state. Also, the bit line equalization signal BLEQL_0 is enabled from the low level to the high level in the precharge operation of the bit line pair BL0 and /BL0, so that the fifth NMOS transistor N5 is turned on.

As described above, when the bit line pair BL0 and /BL0 disposed at the edge portion (hereinafter, referred to as an edge bit line pair) are precharged, the first, the second and the fifth NMOS transistors N1, N2 and N5 are turned on, and the third and the fourth NMOS transistors N3 and N4 are maintained at a turned-on state.

Figure 3:
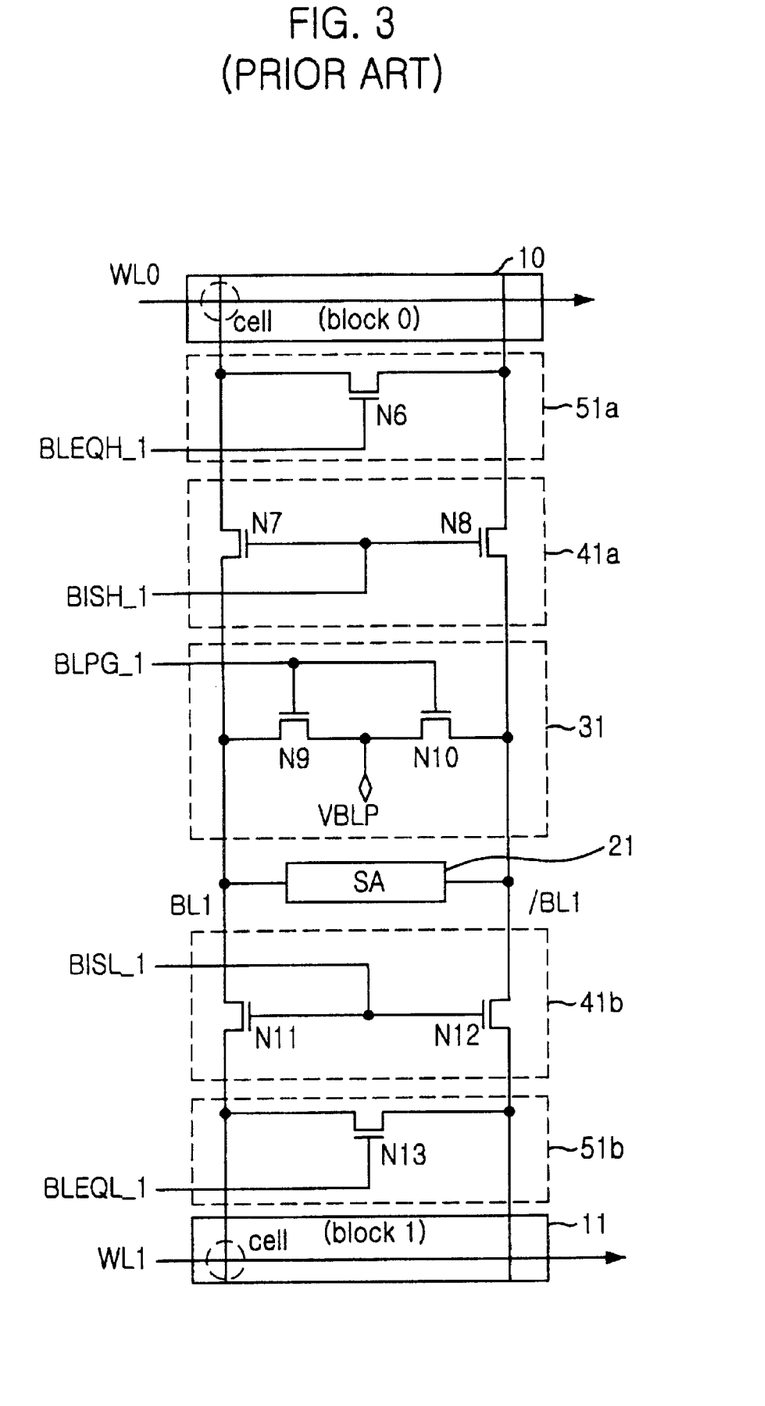
FIG. 3 is a circuit diagram showing a conventional central cell array block and second control block.

FIG. 3 is a circuit diagram showing a central bit line sense amplifier and peripheral circuits, in which one bit line sense amplifier is shared with two cell array blocks. In FIG. 3, for the sake of convenience, only two cell array blocks (a top cell array block 10 and a bottom cell array block 11) are illustrated.

Referring to FIG. 3, the central bit line sense amplifier and peripheral circuits include top and bottom cell array blocks 10 and 11, a sense amplifier 21, a precharge unit 31, a top cell array block selection unit 41a, a top cell array block equalization unit 51a, a bottom cell array block selection unit 41b and a bottom cell array block equalization unit 51b.

The top and the bottom cell array blocks 10 and 11 are arrayed at positions corresponding to a word line and a bit line pair, and are provided with a plurality of memory cell arrays for storing the cell data.

The sense amplifier 21 senses and amplifies the cell data through the bit line pair BL1 and /BL1 commonly coupled to the top and bottom cell array blocks 10 and 11.

The precharge unit 31 precharges the bit line pair BL1 and /BL1 to a predetermined potential level in response to a bit line precharge control signal BLPG_1.

The top cell array block selection unit 41a controls a connection between the top cell array block 10 and the sense amplifier 21 through the bit line pair BL1 and /BL1 in response to a bit line isolation signal BISH_1.

The top cell array block equalization unit 51a is coupled between the top cell array block selection unit 41a and the top cell array block 10, and equalizes the bit line pair BL1 and /BL1 disposed in the direction of the top block 10 in response to a bit line equalization signal BLEQH_1.

The bottom cell array block selection unit 41b controls a connection between the bottom cell array block 11 and the sense amplifier 21 through the bit line pair BL1 and /BL1 in response to a bit line isolation signal BISL_1.

The bottom cell array block equalization unit 51b is coupled between the bottom cell array block selection unit 41b and the bottom cell array block 11, and equalizes the bit line pair BL1 and /BL1 disposed in the direction of the bottom cell array block 11 in response to a bit line equalization signal BLEQL_1.

Here, the precharge unit 31 includes a bit line precharge voltage applying terminal VBLP to which a predetermined potential level is applied, a ninth NMOS transistor N9 and a tenth NMOS transistor N10. A bit line precharge control signal BLPG_1 is commonly applied to each gate of the ninth and the tenth NMOS transistors N9 and N10.

The top cell array block selection unit 41a includes a seventh NMOS transistor N7 and an eighth NMOS transistor N8. The bit line isolation signal BISH_1 is commonly applied to each gate of the seventh and the eighth NMOS transistors N7 and N8.

The top cell array block equalization unit 51a includes a sixth NMOS transistor N6 having a gate receiving the bit line equalization signal BLEQH_1.

The bottom cell array block selection unit 41b includes an eleventh NMOS transistor N11 and a twelfth NMOS transistor N12, each gate of which commonly receives the bit line isolation signal BISL_1.

The bottom cell array block equalization unit 51b includes a thirteenth NMOS transistor N13 whose gate receives the bit line equalization signal BLEQL_1.

Meanwhile, the bit line precharge control signal BLPG_1 is a signal that is enabled from a low level to a high level in the precharge operation of the bit line pair BL1 and /BL1.

The bit line isolation signals BISH_1 and BISL_1 are signals that maintain predetermined levels Vpp greater than the power supply voltage level Vcc in the activation operation of the bit line pair BL1 and /BL1 and are then set to the power supply voltage level Vcc at the precharge operation thereof. The bit line isolation signal BISH_1 used for isolating the top cell array block 10 from the sense amplifier 21 is set to the predetermined level Vpp at the activation of the word line WL0 and is set to the power supply voltage level Vcc in the precharge operation. If the cell data are read out from the bottom cell array block 11, not the top cell array block 10, isolation is not needed, so that the bit line isolation signal BISH_1 is set to the low level.

Also, the bit line isolation signal BISH_1 is a signal that is enabled to the power supply voltage level at the activation of the word line WL0, and the bit line isolation signal BISL_1 is a signal that is set to the power supply voltage level at the precharge operation in order to isolate the bottom cell array block 11 from the bit line sense amplifier 21.

The bit line equalization signals BLEQH_1 and BLEQL_1 are signals that are activated to the high level in order to equalize the bit line pair BL1 and /BL1 to a predetermined potential level. That is, the bit line equalization signal BLEQH_1 is enabled to the high level in order to equalize the bit lines disposed in the direction of the top cell array block 10 at the precharge operation, and the bit line equalization signal BLEQL_1 is enabled to the high level in order to equalize the bit lines disposed in the direction of the bottom cell array block 11.

Referring to FIG. 3, in the precharge operation, the bit line equalization signals BLEQH_1 and BLEQL_1 are enabled from the low level to the high level, and the bit line isolation signals BISH_1 and BISL_1 are set to the power supply voltage level Vcc. Additionally, the bit line precharge control signal BLPG_1 is enabled from the low level to the high level, so that the bit line pair BL1 and /BL1 are shorted to the bit line precharge voltage (VBLP) level. Consequently, the bit line pair BL1 and /BL1 are precharged.

As shown in FIG. 3, the precharge operation of the bit line pair BL1 and /BL1 disposed at the central portion (hereinafter, referred to as a central bit line pair) is performed through eight NMOS transistors N6 to N13.

Figure 4:
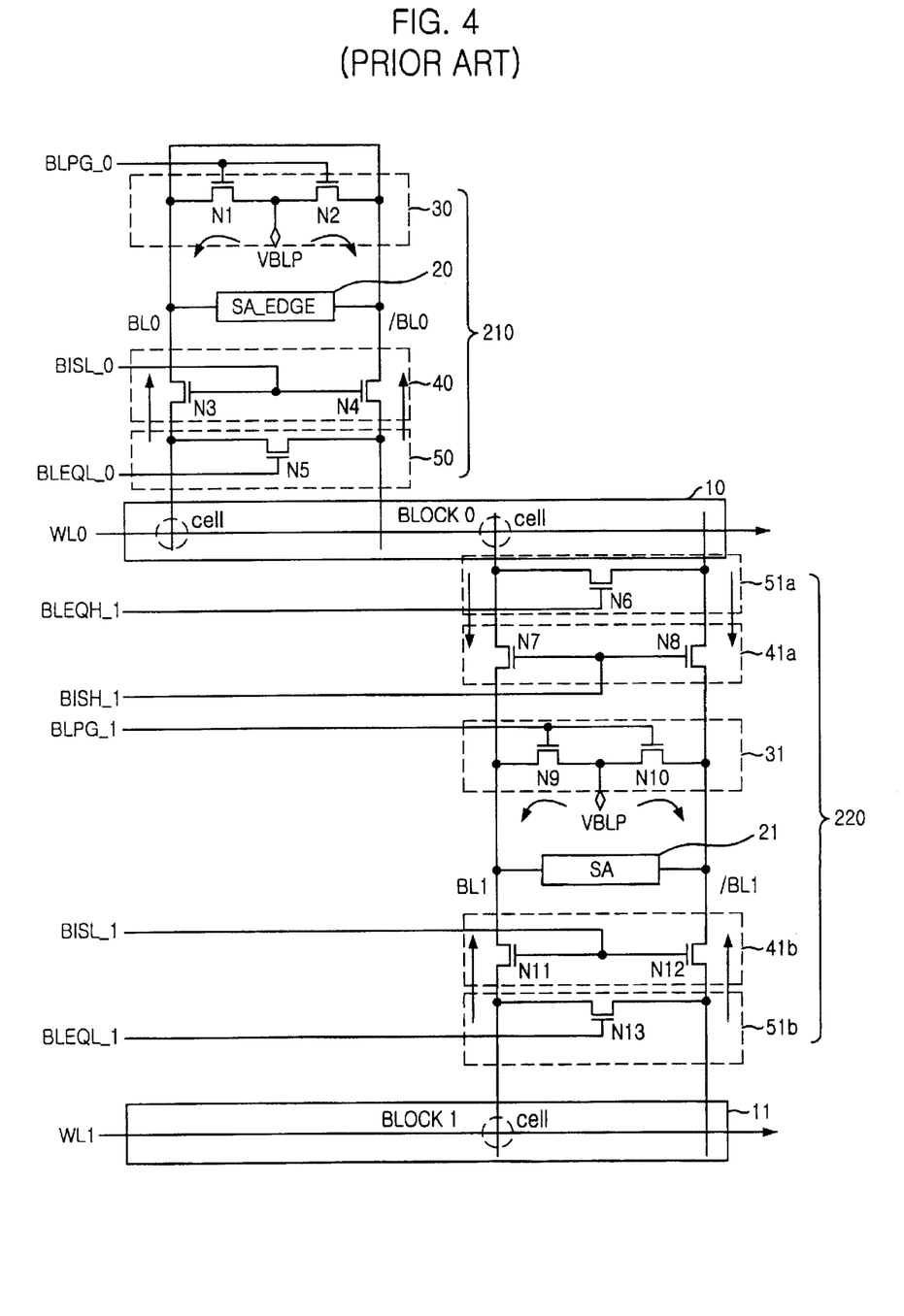
FIG. 4 is a circuit diagram showing a conventional memory device incorporating the edge cell array block and first control block of FIG. 2.

FIG. 4 is a circuit diagram of the conventional memory device, showing the precharge operation of the central and edge bit line pairs carried out by disabling the word line WL0 of the top cell array block.

Referring to FIG. 4, the conventional memory device includes a plurality of cell array blocks 10 and 11 and a bit line control block 210 and 220. The bit line control block includes a first control block 210 and a second control block 220.

The cell array blocks 10 and 11 are provided with a plurality of memory cells operating according to signals of word lines WL0 and WL1, a first bit line pair BL0 and /BL0 and a second bit line pair BL1 and /BL1.

The first control block 210 is separately coupled to the first bit line pair BL0 and /BL0 which are coupled to the top cell array block 10 among the cell array blocks, and the second control block 220 is shared with the second bit line pair BL1 and /BL1 which are coupled between the top cell array block 10 and the bottom cell array block 11.

The first control block 210 also includes an edge sense amplifier 20, a precharge unit 30, a cell array block selection unit 40 and an equalization unit 50.

The edge sense amplifier 20 senses the cell data stored in the memory cell of the top cell array block 10 through the first bit line pair BL0 and /BL0. The precharge unit 30 is coupled between the edge sense amplifier 20 and an end portion of the first bit line pair BL0 and /BL0, and precharges the first bit line pair BL0 and /BL0 to a predetermined level VBLP1 in response to a bit line precharge control signal BLPG_0.

The cell array block selection unit 40 controls a connection between the top cell array block 10 and the edge sense amplifier 20 in response to a bit line isolation signal BISL__0. The equalization unit 50 is coupled between the cell array block selection unit 40 and the top cell array block 10, and equalizes the first bit line pair BL0 and /BL0 in response to a bit line equalization signal BLEQL__0.

The second block 220 also includes a central sense amplifier 21, a precharge unit 31, a first cell array block selection unit 41a, a first equalization unit 51a, a second cell array block selection unit 41b and a second equalization unit 51b.

The central sense amplifier 21 senses the cell data stored in the memory cell of the top and bottom cell array blocks 10 and 11 through the second bit line pair BL1 and /BL1 coupled to the top cell array block 10 and the bottom cell array block 11.

The precharge unit 31 is coupled between the central sense amplifier 21 and the top cell array block 10, and precharges the second bit line pair BL1 and /BL1 to a predetermined level VBLP1 in response to a bit line precharge control signal BLPG__1.

The first cell array block selection unit 41a controls a connection between the top cell array block 10 and the central sense amplifier 21 in response to a first bit line isolation signal BISH__1. The first equalization unit 51a is coupled between the first cell array block selection unit 41a and the top cell array block 10, and equalizes the second bit line isolation signal BL1 and /BL1 in response to a first bit line equalization signal BLEQH__1.

The second cell array block selection unit 41b controls a connection between the bottom cell array block 11 and the central sense amplifier 21 in response to a second bit line isolation signal BISL__1. The second equalization unit 51b is coupled between the second cell block selection unit 41b and the bottom cell array block 11, and equalizes the second bit line pair BL1 and /BL1 in response to a second bit line equalization signal BLEQL__1.

Meanwhile, the precharge units 30 and 31 contained in the first and the second control blocks 210 and 220 also include bit line precharge voltage applying terminals VBLP1 and NMOS transistors N1 and N2, N9 and N10, respectively. The bit line precharge control signal BLPG__0 is commonly applied to each gate of the NMOS transistors N1 and N2, and the bit line precharge control signal BLPG__1 is commonly applied to each gate of the NMOS transistors N9 and N10.

The cell array block selection units 40, 41a and 41b are implemented with NMOS transistors N3 and N4, N7 and N8, N11 and N12, each of whose gates commonly receives the bit line isolation signals BISL__0, BISH__1 and BISL__1, respectively.

Also, the equalization units 50, 51a and 51b are implemented with NMOS transistors N5, N6, N13, each of whose gates receives the bit line equalization signals BLEQL__0, BLEQH__1 and BLEQL__1, respectively.

Here, the bit line precharge control signal BLPG__0 is a signal that is activated in the precharge operation of the bit lines. That is, the bit line precharge control signal BLPG__0 is enabled from a low level to a high level when the first bit line pair BL0 and /BL0 are precharged, and the bit line precharge control signal BLPG__1 is enabled from a low level to a high level when the second bit line pair BL1 and /BL1 are precharged.

The bit line isolation signals BISL and BISH are used to select the bottom cell array block and the top cell array block, respectively. That is, the bit line isolation signals BISL__0, BISL__1 and BISH__1 are maintained at a predetermined level Vpp higher than the power supply voltage level Vcc at the activation operation and are set to the power supply voltage level Vcc when the first and the second bit line pairs BL0, /BL0, BL1 and /BL1 are precharged.

The bit line equalization signal BLEQL__0 is a signal that is activated to equalize the bit lines to a predetermined potential level. That is, the bit line equalization signal BLEQL__0 is enabled from a low level to a high level at the precharge operation of the first bit line pair BL0 and /BL0.

Referring to FIG. 4, when the first bit line pair BL0 and /BL0 and the second bit line pair BL1 and /BL1 are precharged, the bit lines BL1 and /BL1 of the central sense amplifier 21 disposed between the top cell array block 10 and the bottom cell array block 11 are precharged through eight NMOS transistors N6 to N13. Meanwhile, the bit lines BL0 and /BL0 of the edge sense amplifier 20 disposed at only one block (the top cell array block) are precharged through five NMOS transistors N1 to N5.

As described above, when the bit lines are precharged, the precharge time of the edge bit lines is different from that of the central bit lines. Particularly, since the precharge speed of the edge bit lines is slowest, the characteristic of a bit line precharge time tRP is degraded.

Here, the bit line precharge time tRP is the time taken until the bit lines are again activated after a precharge command of the bit lines. If the precharge speed at the edge bit lines is different from that at the central bit lines, it causes degradation of the characteristic of the bit line precharge time tRP.

Accordingly, in order to prevent the degradation of the characteristic of the bit line precharge time tRP, a method for reducing the precharge speed difference between the edge bit lines and the central bit lines is required.

SUMMARY OF THE INVENTION

It is, therefore, an object of the present invention to provide a memory device capable of preventing a characteristic of the bit line precharge time tRP from being degraded due to a precharge speed difference between the edge bit lines and the central bit lines.

In accordance with an aspect of the present invention, there is provided a memory device comprising: a plurality of cell array blocks provided with a plurality of memory cells coupled to a word line and a bit line pair; a bit line control block including a first control block and a second control block, wherein the first control block is separately coupled to a first bit line pair coupled to a first cell array block among the cell array blocks, and the second control block is shared with a second bit line pair commonly coupled to the first cell array block and a second cell array block adjacent to the first cell array block; and a precharge reinforcement means, coupled to a predetermined portion of the first control block, for reducing a precharge speed difference between the first bit line pair and the second bit line pair.

In accordance with another aspect of the present invention, there is provided a memory device comprising: a plurality of cell array blocks provided with a plurality of memory cells coupled to a word line and a bit line pair; a bit line control block including a first control block and a second control block, wherein the first control block is separately coupled to a first bit line pair coupled to a first cell array block among the cell array blocks, and the second control block is shared with the first bit line pair commonly coupled to the first cell array block and a second cell array block adjacent to the first cell array block; a precharge voltage applying terminal for providing a precharge voltage to the first bit line pair; an equalizing reinforcement means for equalizing the first bit line pair to the precharge voltage level provided from the precharge voltage applying terminal; and a precharge reinforcement means, coupled between the equalizing reinforcement means and the first control block, for reducing a precharge speed difference between the first bit line pair and the second bit line pair.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Figure 5:
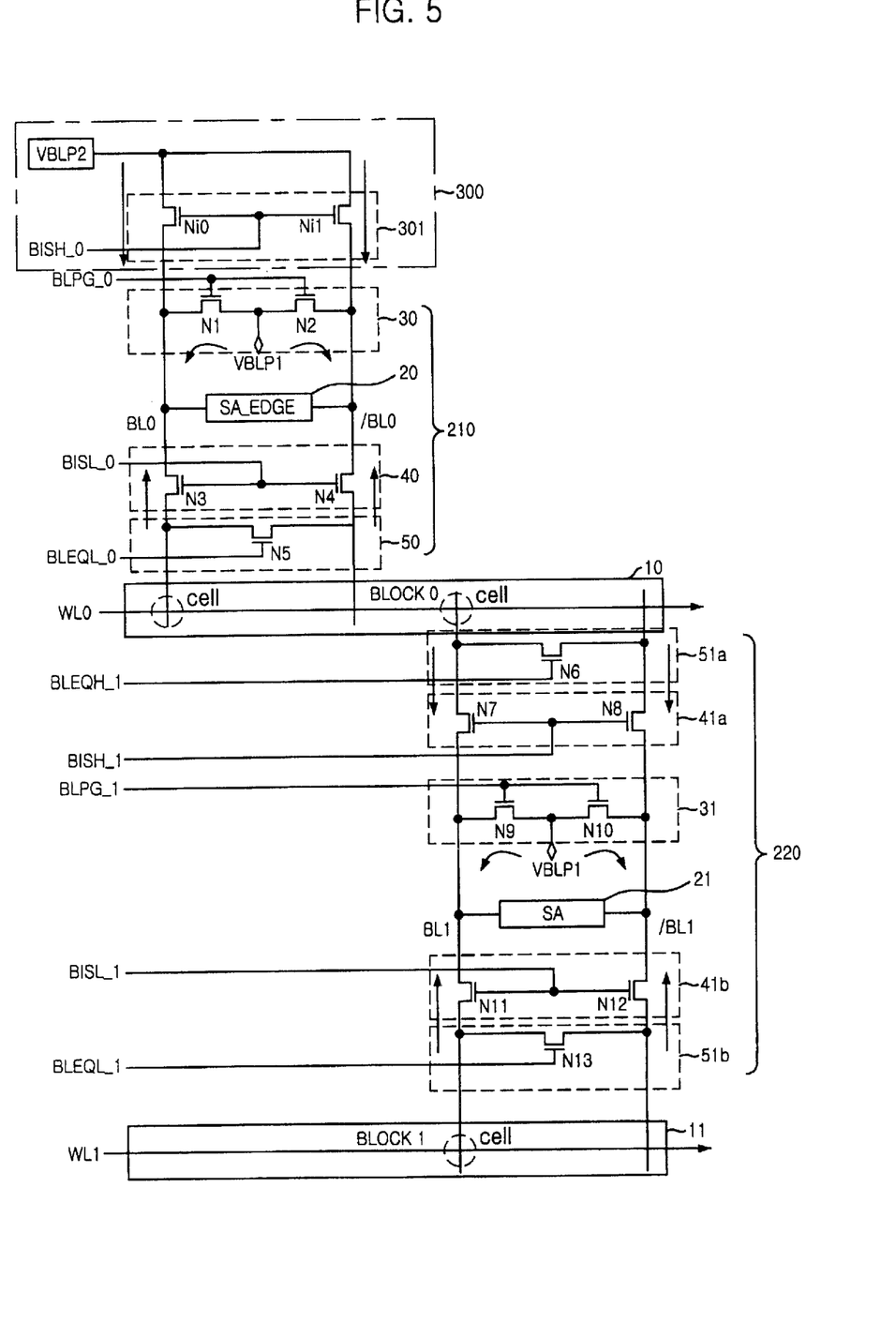
FIG. 5 is a circuit diagram illustrating a memory device in accordance with a first embodiment of the present invention.

FIG. 5 is a circuit diagram illustrating a memory device in accordance with a first embodiment of the present invention. The same numeral references as the prior art memory device shown in FIG. 4 indicate the same elements.

Referring to FIG. 5, the memory device in accordance with the first embodiment of the present invention includes a plurality of cell array blocks 10 and 11, a bit line control block 210 and 220 and a precharge reinforcement unit 300. The bit line control block also includes a first control block 210 and a second control block 220.

The plurality of the cell array blocks 10 and 11 are provided with a plurality of memory cells coupled to word lines WL0 and /WL1, a first bit line pair BL0 and /BL0 and a second bit line pair BL1 and /BL1.

The first control block 210 is separately coupled to the first bit line pair BL0 and /BL1 coupled to the top cell array block 10 disposed at the edge portion, and the second control block 220 is shared with the second bit line pair BL1 and /BL1 commonly coupled between the top cell array block 10 and the bottom cell array block 11 disposed at the central portion.

The precharge reinforcement unit 300 is coupled to one portion of the first control block 210, and reduces a precharge speed difference between the first bit line pair BL0 and /BL0 and the second bit line pair BL1 and /BL1.

Here, the precharge reinforcement unit 300 includes a voltage applying terminal VBLP2, to which a precharge voltage VBLP2 is applied, and a switching unit 301 for precharging the first bit line pair BL0 and /BL0 to the precharge voltage VBLP2.

The switching unit 301 is implemented with NMOS transistors N10 and NI1 having sources and drains coupled between the voltage applying terminal VBLP2 and the first bit line pair BL0 and /BL0, respectively, and gates commonly receiving a bit line isolation signal BISH_0. The bit line isolation signal BISH_0 is activated to a high level only when the first bit line pair BL0 and /BL0 are precharged.

The first control block 210 also includes an edge sense amplifier 20, a precharge unit 30, a cell array block selection unit 40 and an equalization unit 50.

The edge sense amplifier 20 senses the cell data stored in the memory cell of the top cell array block 10 through the first bit line pair BL0 and /BL0. The precharge unit 30 is coupled between the edge sense amplifier 20 and an end portion of the first bit line pair BL0 and /BL0, and precharges the first bit line pair BL0 and /BL0 to a predetermined level VBLP1 in response to a bit line precharge control signal BLPG_0.

The cell array block selection unit 40 controls a connection between the top cell array block 10 and the edge sense amplifier 20 in response to a bit line isolation signal BISL_0. The equalization unit 50 is coupled between the cell array block selection unit 40 and the top cell array block 10, and equalizes the first bit line pair BL0 and /BL0 in response to a bit line equalization signal BLEQL_0.

The second control block 220 also includes a central sense amplifier 21, a precharge unit 31, a first cell array block selection unit 41a, a first equalization unit 51a, a second cell array block selection unit 41b and a second equalization unit 51b.

The central sense amplifier 21 senses the cell data stored in the memory cells of the top and bottom cell array blocks 10 and 11 through the second bit line pair BL1 and /BL1 coupled to the top cell array block 10 and the bottom cell array block 11. The precharge unit 31 is coupled between the central sense amplifier 21 and the top cell array block 10, and precharges the second bit line pair BL1 and /BL1 to a predetermined level VBLP1 in response to a bit line precharge control signal BLPG_1.

The first cell array block selection unit 41a controls a connection between the top cell array block 10 and the central sense amplifier 21 in response to a first bit line isolation signal BISH_1. The first equalization unit 51a is coupled between the first cell array block selection unit 41a and the top cell array block 10, and equalizes the second bit line isolation signal BL1 and /BL1 in response to a first bit line equalization signal BLEQH_1.

The second cell array block selection unit 41b controls a connection between the bottom block 11 and the central sense amplifier 21 in response to a second bit line isolation signal BISL_1. The second equalization unit 51b is coupled between the second cell array block selection unit 41b and the bottom block 11, and equalizes the second bit line pair BL1 and /BL1 in response to a second bit line equalization signal BLEQL_1.

Meanwhile, the precharge units 30 and 31 contained in the first and the second control blocks 210 and 220 include bit line precharge voltage applying terminals VBLP1 and NMOS transistors N1 and N2, N9 and N10, respectively. The bit line precharge control signal BLPG_0 is commonly applied to each gate of the NMOS transistors N1 and N2, and the bit line precharge control signal BLPG__1 is commonly applied to each gate of the NMOS transistors N9 and N10.

The cell array block selection units 40, 41a and 41b are implemented with NMOS transistors N3 and N4, N7 and N8, N11 and N12, each of whose gates receives the bit line isolation signals BISL__0, BISH__1 and BISL__1, respectively.

Also, the equalization units 50, 51a and 51b are implemented with NMOS transistors N5, N6, N13, each of whose gates receives the bit line equalization signals BLEQL__0, BLEQH__1 and BLEQL__1, respectively.

Here, the bit line precharge control signal BLPG is a signal that is activated when the bit lines are precharged. That is, the bit line precharge control signal BLPG__0 is enabled from a low level to a high level when the first bit line pair BL0 and /BL0 are precharged, and the bit line precharge control signal BLPG__1 is enabled from a low level to a high level when the second bit line pair BL1 and /BL1 are precharged.

The bit line isolation signals BISL and BISH are used to select the bottom cell array block and the top cell array block, respectively. That is, the bit line isolation signals BISL__0, BISL__1 and BISH__1 are maintained at a predetermined level Vpp higher than the power supply voltage level Vcc in the activation operation and are set to the power supply voltage level Vcc when the first and the second bit line pairs are precharged. The bit line isolation signal BISH__0 is a signal that is enabled from a low level (Vss) to a high level Vcc.

The bit line equalization signal BLEQL__0 is a signal that is activated to equalize the bit lines to a predetermined potential level. That is, the bit line equalization signal BLEQL__0 is enabled from a low level to a high level when the first bit line pair BL0 and /BL0 are precharged.

As shown in FIG. 5, the NMOS transistors N10 and NI1 which are turned on in response to the bit line isolation signal BISH__0 are added in the upper portion of the precharge unit 30 contained in the first control block 210. The bit line isolation signal BISH__0 which is commonly applied to the gates of the NMOS transistors N10 and NI1 is activated from the low level to the high level only in the precharge operation of the first bit line pair BL0 and /BL0. Therefore, by turning on the NMOS transistors N10 and NI1, the precharge operation can be performed faster due to the bit line precharge voltage VBLP2 applied to the sources of the NMOS transistors N10 and NI1.

The bit line precharge isolation signal BISH__0 maintains the low level at the enable operation of the first bit line pair BL0 and /BL0 and is activated to the high level only in the precharge operation of the first bit line pair BL0 and /BL0, so that the precharge reinforcement unit 300 serves as a precharge circuit of the first control block 210 coupled to the first bit line pair BL0 and /BL0.

The precharge operation of the bit lines will be described below with reference to FIG. 7.

First, when the word line WL0 of the top cell array block 10 is enabled and then disabled, the bit line pair should be precharged. At this time, the precharge control signal BLPG__0 and the bit line isolation signal BISH__0 are set to their high levels simultaneously, so that the NMOS transistors N10 and NI1 contained in the precharge reinforcement unit 300 are turned on. Therefore, the first bit line pair BL0 and /BL0 are precharged to the precharge voltage VBLP2. Almost at the same time, since the bit line precharge control signal BLPG__0 is enabled to the high level, the first bit line pair BL0 and /BL0 are precharged to the precharge voltage VBLP1. Therefore, compared with the prior art, the precharge speed of the first control block 210 is fast.

Next, the bit line isolation signal BISL__0 maintains the level higher than the power supply voltage level and then reaches the power supply voltage level so that the NMOS transistors N3 and N4 continuously maintain the turned-on state. Also, the bit line equalization signal BLEQL__0 is enabled to the high level so that the NMOS transistor N5 is turned on. As a result, the first bit line pair BL0 and /BL0 are shorted.

Figure 6:
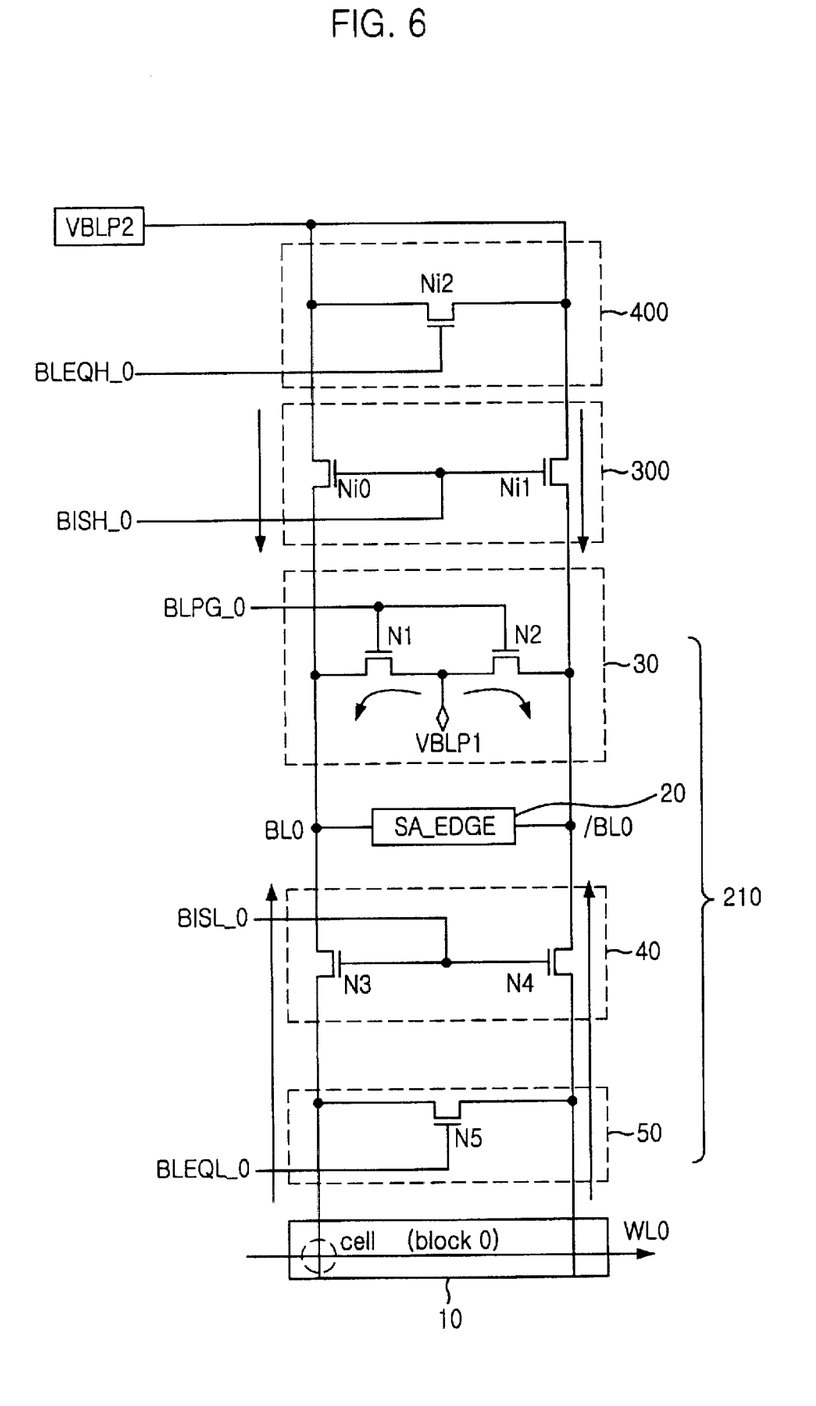
FIG. 6 is a circuit diagram illustrating a memory device in accordance with a second embodiment of the present invention.

FIG. 6 is a circuit diagram illustrating a memory device in accordance with a second embodiment of the present invention. In FIG. 6, only the first control block and the edge cell array block (top cell array block) of FIG. 5 are illustrated.

Referring to FIG. 6, the memory device in accordance with the second embodiment of the present invention includes a plurality of cell array blocks 10 and 11, a bit line control block 210 and 220, a precharge voltage applying terminal VBLP2 coupled to an end portion of the first bit line pair BL0 and /BL0, an equalization reinforcement unit 400 and a precharge reinforcement unit 300. The bit line control block also includes a first control block 210 and a second control block 220.

The plurality of cell array blocks 10 and 11 are provided with a plurality of memory cells coupled to word lines WL0 and /WL1, a first bit line pair BL0 and /BL0 and a second bit line pair BL1 and /BL1.

The first control block 210 is separately coupled to the first bit line pair BL0 and /BL1 coupled to the top cell array block 10, and the second control block 220 is shared with the second bit line pair BL1 and /BL1 commonly coupled between the top cell array block 10 and the bottom cell array block 11.

The equalization reinforcement unit 400 equalizes the first bit line pair BL0 and /BL0 of the first control block 210 to a voltage level applied from the precharge voltage applying terminal. The precharge reinforcement unit 300 is coupled between the equalization reinforcement unit 400 and the first control block 210, and reduces a precharge speed difference between the first bit line pair BL0 and /BL0 and the second bit line pair BL1 and /BL1.

Here, the equalization reinforcement unit 400 is implemented with an NMOS transistor NI2 having a source and a drain coupled between the first bit line pair BL0 and /BL0 and a gate receiving one of a signal BLEQH__0 enabled from a low level to a high level only in a precharge operation of the first control block 210 and a signal maintaining a DC high level.

The precharge reinforcement unit 300 includes switching transistors N10 and NI1 for precharging the first bit line pair BL0 and /BL0 to an equalization level equalized by the equalization reinforcement unit 400.

The first control block 210 also includes an edge sense amplifier 20, a precharge unit 30, a cell array block selection unit 40 and an equalization unit 50.

The edge sense amplifier 20 senses the cell data stored in the memory cell of the top cell array block 10 through the first bit line pair BL0 and /BL0. The precharge unit 30 is coupled between the edge sense amplifier 20 and an end portion of the first bit line pair BL0 and /BL0, and precharges the first bit line pair BL0 and /BL0 to a predetermined level VBLP1 in response to a bit line precharge control signal BLPG__0.

The cell array block selection unit 40 controls a connection between the top cell array block 10 and the edge sense amplifier 20 in response to a bit line isolation signal BISL_0. The equalization unit 50 is coupled between the cell array block selection unit 40 and the top cell array block 10, and equalizes the first bit line pair BL0 and /BL0 in response to a bit line equalization signal BLEQL_0.

The second block 220 also includes a central sense amplifier 21, a precharge unit 31, a first cell array block selection unit 41a, a first equalization unit 51a, a second cell array block selection unit 41b and a second equalization unit 51b.

The central sense amplifier 21 senses the cell data stored in the memory cells of the top and bottom cell array blocks 10 and 11 through the second bit line pair BL1 and /BL1 coupled to the top cell array block 10 and the bottom cell array block 11. The precharge unit 31 is coupled between the central sense amplifier 21 and the top cell array block 10, and precharges the second bit line pair BL1 and /BL1 to a predetermined level VBLP1 in response to a bit line precharge control signal BLPG_1.

The first cell array block selection unit 41a controls a connection between the top cell array block 10 and the central sense amplifier 21 in response to a first bit line isolation signal BISH_1. The first equalization unit 51a is coupled between the first cell array block selection unit 41a and the top cell array block 10, and equalizes the second bit line isolation signal BL1 and /BL1 in response to a first bit line equalization signal BLEQH_1.

The second cell array block selection unit 41b controls a connection between the bottom cell array block 11 and the central sense amplifier 21 in response to a second bit line isolation signal BISL_1. The second equalization unit 51b is coupled between the second cell block selection unit 41b and the bottom cell array block 11, and equalizes the second bit line pair BL1 and /BL1 in response to a second bit line equalization signal BLEQL_1.

Meanwhile, the precharge units 30 and 31 contained in the first and the second control blocks 210 and 220 also include bit line precharge voltage applying terminals VBLP1 and switching transistors N1 and N2, N9 and N10, respectively. The bit line precharge control signal BLPG_0 is commonly applied to each gate of the switching transistors N1 and N2, and the bit line precharge control signals BLPG_1 is commonly applied to each 25 gate of the switching transistors N9 and N10.

The cell array block selection units 40, 41a and 41b are implemented with NMOS transistors N3 and N4, N7 and N8, N11 and N12, each of whose gates receives the bit line isolation signals BISL_0, BISH_1 and BISL_1, respectively.

Also, the equalization units 50, 51a and 51b are implemented by NMOS transistors N5, N6, N13, each of whose gates receives the bit line equalization signals BLEQL_0, BLEQH_1 and BLEQL_1, respectively.

Here, the bit line precharge control signals BLPG_0 and BLPG_1 are signals that are activated at the precharge operation of the bit lines. That is, the bit line precharge control signal BLPG_0 is enabled from a low level to a high level when the first bit line pair BL0 and /BL0 are precharged, and the bit line precharge control signal BLPG_1 is enabled from a low level to a high level when the second bit line pair BL1 and /BL1 are precharged.

The bit line isolation signals BISL_0 and BISL_1 and BISH_1 are used to select the bottom cell array block and the top cell array block, respectively. That is, the bit line isolation signals BISL_0, BISL_1 and BISH_1 are maintained at a predetermined level Vpp higher than the power supply voltage level Vcc in the activation operation and are set to the power supply voltage level Vcc in the precharge operation of the first and the second bit lines. The bit line isolation signal BISH_0 is a signal that is enabled from a low level (Vss) to a high level (Vcc) only at the precharge operation of the first bit line pair BL0 and /BL0.

The bit line equalization signals BLEQ_0 and BLEQ_1 are signals that are activated to equalize the bit lines to a predetermined potential level. That is, the bit line equalization signals BLEQL_0 and BLEQH_0 are enabled from a low level to a high level at the precharge operation of the first bit line pair BL0 and /BL0.

As shown in FIG. 6, the NMOS transistors N10 and NI1 and the NMOS transistor NI2, which are turned on in response to the bit line isolation signal BISH_0 and the bit line isolation signal BLEQH_0, respectively, are added in the upper portion of the precharge unit 30 contained in the first control block 210.

The bit line isolation signal BISH_0 which is commonly applied to the gates of the NMOS transistors N10 and NI1 is activated from the low level to the high level only at the precharge operation of the first bit line pair BL0 and /BL0. Therefore, by turning on the NMOS transistors N10 and NI1, the precharge operation can be performed quickly due to the bit line precharge voltage (VBLP2) level applied to the sources of the NMOS transistors NI0 and NI1.

The bit line precharge isolation signal BISH_0 maintains the low level at the enable operation of the first bit line pair BL0 and /BL0 and is activated to the high level only at the precharge operation of the first bit line pair BL0 and /BL0, so that the precharge reinforcement unit 300 serves as a precharge circuit of the first control block 210 coupled to the first bit line pair BL0 and /BL0.

The bit line equalization signal BLEQH_0 is a signal that is enabled to the high level at the precharge operation of the first bit line pair BL0 and /BL0 and is enabled to a low level at the enable operation thereof. Also, the bit line equalization signal BLEQH_0 can maintain a DC high level.

The precharge operation of the bit lines will be described below with reference to FIG. 7.

First, when the word line WL0 of the top cell array block is enabled and then disabled, the first bit line pair BL0 and /BL0 should be precharged. At this time, the precharge control signal BLPG_0, the bit line isolation signal BISH_0 and the bit line equalization signal BLEQH_0 are set to the high levels simultaneously, so that the NMOS transistors NI2 are turned on. Therefore, the first bit line pair BL0 and /BL0 are equalized to the precharge voltage VBLP2. Then, the bit line isolation signal BISH_0 is set to the high level so that the NMOS transistors N10 and NI1 are turned on. As a result, the first bit line pair BL0 and /BL0 are precharged to the precharge voltage VBLP2.

Almost at the same time, since the bit line precharge control signal BLPG_0 is enabled to the high level, the first bit line pair BL0 and /BL0 which are precharged in advance to the precharge voltage VBLP2 are precharged to the precharge voltage VBLP1.

Next, the bit line isolation signal BISL_0 maintains the level higher than the power supply voltage level and then reaches the power supply voltage level so that the NMOS transistors N3 and N4 continuously maintain the turned-on state. Also, the bit line equalization signal BLEQL_0 is enabled to the high level so that the NMOS transistor N5 is turned on. As a result, the first bit line pair BL0 and /BL0 are shorted.

In accordance with the second embodiment of the present invention shown in FIG. 6, when the first bit line pair are precharged, the equalization operation is reinforced by adding the equalization reinforcement unit to the first bit line pair coupled to the edge cell array block.

Additionally, the precharge reinforcement unit and the equalization reinforcement unit are added, thereby having the same structure as the second control block. Consequently, the management of the layout and structure becomes easier.

Figure 7:
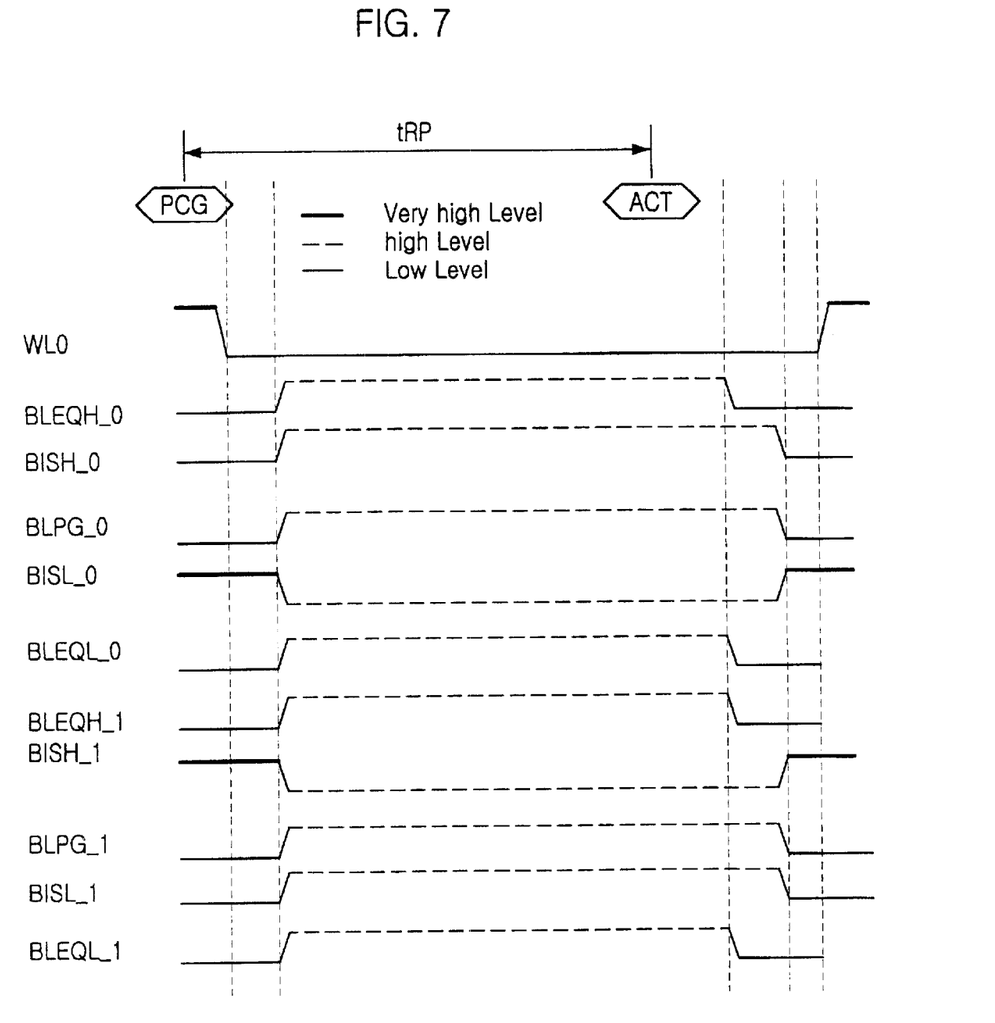
FIG. 7 is a timing chart illustrating control signals applied to the memory devices in accordance with the first and the second embodiments of the present invention.

FIG. 7 is a timing chart of the control signals shown in FIGS. 5 and 6. Reference symbols PCG and ACT denote a precharge operation and an enable operation, respectively.

Referring to FIG. 7, the word line WL0 is activated and then is initially set to the low level (Vss. Next, the bit line equalization signals BLEQH_0, BLEQL_0, BLEQH_1 and BLEQL_1 and the bit line precharge signals BLPG_0 and BLPG_1 are set to the high level.

Here, the reason that the word line WL0 is initially enabled to the low level is to prevent the level equalized due to the precharge operation PCG from flowing into the memory cells.

Next, in the enable operation ACT, the data stored in the memory cells are read out. At this time, the signals for equalizing the bit lines BL and /BL should be disabled before the data stored in the cells are transferred to the bit lines BL and /BL due to the activation of the word line WL0. Therefore, the equalization signals BLEQH_0, BLEQL_0, BLEQH_1 and BLEQL_1 and the precharge signals BLPG_0 and BLPG_1 are disabled, and then, the bit line isolation signals BISH_0, BISL_0, BISH_1 and BISL_1 are enabled. Finally, the word line WL0 is enabled to thereby transfer the cell data to the bit line pair.

As described above, the precharge speed difference between the central bit lines and the edge bit lines can be reduced by adding the bit line isolation signal BISH_0 and the bit line equalization signal BLEQH_0, which are set from the low level to the high level only at the precharge operation of the bit lines.

Figure 8:
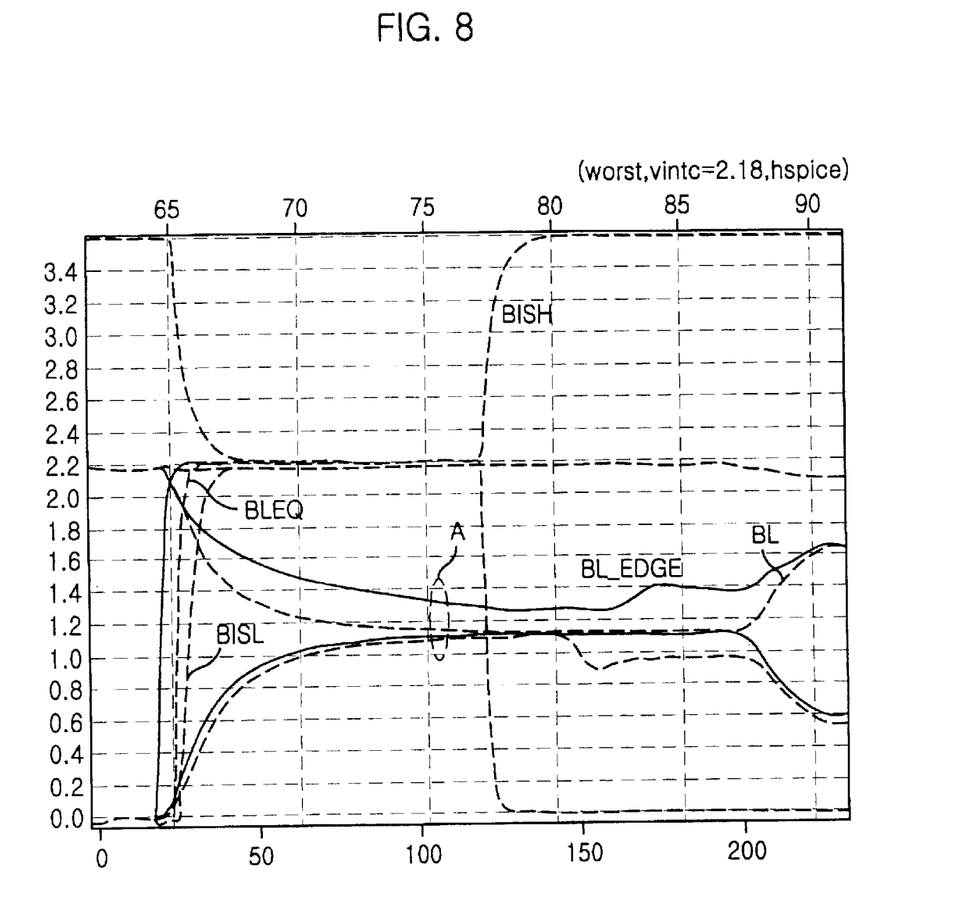
FIG. 8 is a diagram showing a characteristic of a bit line precharge time tRP according to the prior art.

FIG. 8 is a simulation result showing the characteristic of the bit line precharge time tRP according to the prior art.

As shown in FIG. 8, when the bit line equalization signal BLEQ is the high level, the precharge speed difference and the equalization-ability difference between the edge bit lines BL_EDGE and the central bit lines BL occur. That is, the equalization ability of the edge bit lines BL_EDGE is weak compared with that of the central bit lines BL (referring to a portion "A").

Figure 9:
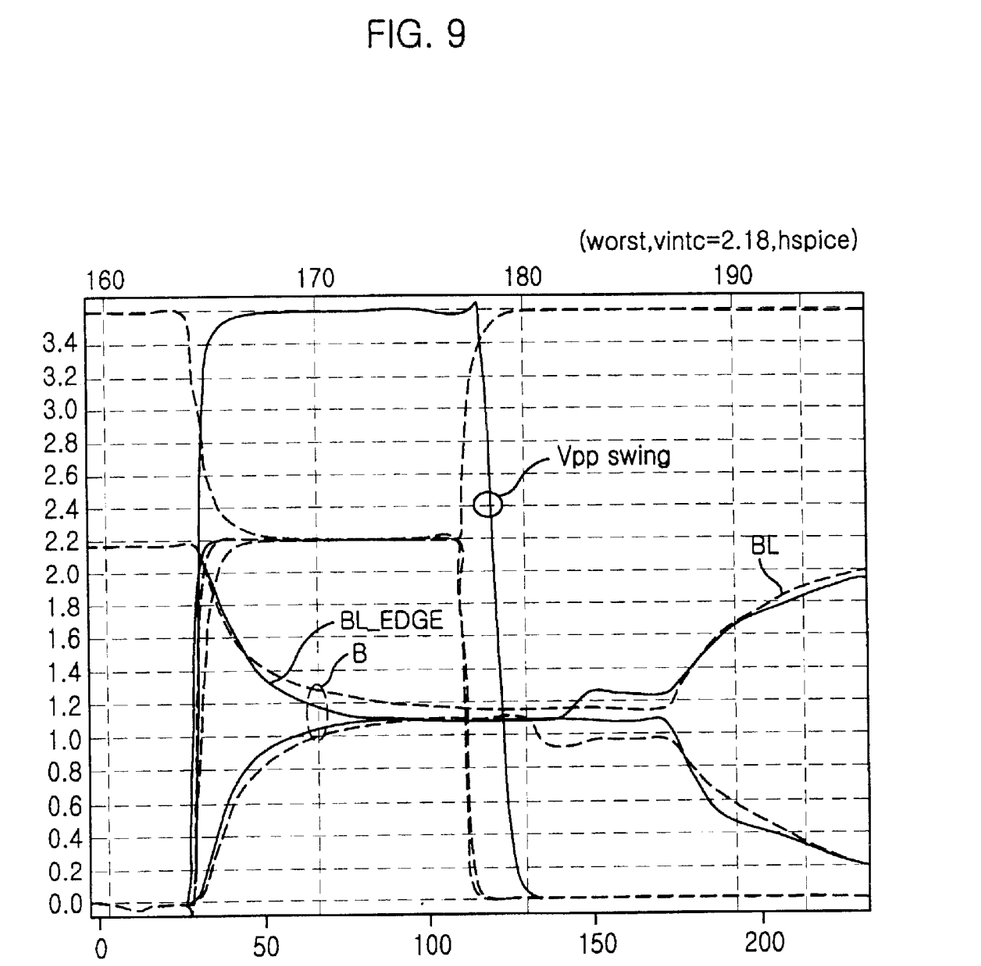
FIG. 9 is a diagram illustrating a characteristic of a bit line precharge time tRP according to the present invention.

FIG. 9 is a simulation result illustrating the characteristic of the bit line precharge time tRP according to the present invention. The equalization ability of the edge bit lines BL_EDGE is improved due to the bit line isolation signal BISH_0 and the bit line equalization signal BLEQH_0 (referring to a portion "B"). Furthermore, the precharge speed difference between the edge bit lines and the central bit lines is reduced. At this time, a reference symbol VPP_SWING denotes the swing of the bit line isolation signal BISL_0 from the power supply voltage level to the predetermined level Vpp.

As mentioned above, by adding the switching transistors and the equalization transistors to the edge portion where there exists no cell, the bit line precharge circuit can improve the characteristic of the bit line precharge time tRP of the edge bit lines.

Although preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A memory device comprising:
   a plurality of cell array blocks provided with a plurality of memory cells coupled to a word line and a bit line pair;
   a bit line control block including a first control block and a second control block, wherein the first control block is separately coupled to a first bit line pair coupled to a first cell array block among the cell array blocks, and the second control block is shared with a second bit line pair commonly coupled to the first cell array block and a second cell array block adjacent to the first cell array block; and
   precharge reinforcement means, coupled to a predetermined portion of the first control block, for reducing a precharge speed difference between the first bit line pair and the second bit line pair.

2. The memory device as recited in claim 1, wherein the precharge reinforcement means includes:
   a voltage applying terminal for providing a voltage for precharging the first bit line pair; and
   a switching unit for precharging the first bit line pair to a level of the voltage provided from the voltage applying terminal.

3. The memory device as recited in claim 2, wherein the switching unit includes a transistor having a source and a drain coupled to the first bit line pair and a gate receiving a signal changing from a low level to a high level only in a precharge operation of the first control block.

4. The memory device as recited in claim 3, wherein the transistor is an NMOS transistor.

5. The memory device as recited in claim 1, wherein the first control block includes:
   a sense amplifier for sensing data stored in the memory cells of the first cell array block through the first bit line pair;
   a precharge unit, coupled between the sense amplifier and an end portion of the first bit line pair, for precharging the first bit line pair to a predetermined level in response to a bit line precharge control signal;
   a cell array block selection unit for controlling a connection between the first cell array block and the sense amplifier in response to a bit line isolation signal; and
   an equalization unit, coupled between the cell array block selection unit and the first cell array block, for equalizing the first bit line pair in response to a bit line equalization signal.

6. The memory device as recited in claim 1, wherein the second control block includes:
   a sense amplifier for sensing data stored in the memory cells of the second cell array block through the second bit line pair commonly coupled to the first cell array block and the second cell array block;
   a precharge unit, coupled between the sense amp and the first cell array block, for precharging the second bit line pair to a predetermined level in response to a bit line precharge control signal;
   a first cell array block selection unit for controlling a connection between the first cell array block and the sense amplifier in response to a first bit line isolation signal;
   a second cell array block selection unit, coupled between the first cell array block selection unit and the first cell array block, for equalizing the second bit line pair in response to a first bit line equalization signal; and a second equalization unit, coupled between the second cell array block selection unit and the second cell array block, for equalizing the second bit line pair in response to a second bit line equalization signal.

7. A memory device comprising:

a plurality of cell array blocks provided with a plurality of memory cells coupled to a word line and a bit line pair;

a bit line control block including a first control block and a second control block, wherein the first control block is separately coupled to a first bit line pair coupled to a first cell array block among the cell array blocks, and the second control block is shared with the first bit line pair commonly coupled to the first cell array block and a second cell array block adjacent to the first cell array block;

a precharge voltage applying terminal for providing a precharge voltage to the first bit line pair;

equalization reinforcement means for equalizing the first bit line pair to the precharge voltage level provided from the precharge voltage applying terminal; and precharge reinforcement means, coupled between the equalization reinforcement means and the first control block, for reducing a precharge speed difference between the first bit line pair and the second bit line pair.

8. The memory device as recited in claim 7, wherein the equalization reinforcement means includes a transistor having a source and a drain coupled to the first bit line pair and a gate receiving one of a signal enabled from a low level to a high level only in a precharge operation of the first control block and a signal maintaining a DC high level.

9. The memory device as recited in claim 8, wherein the transistor is an NMOS transistor.

10. The memory device as recited in claim 7, wherein the precharge reinforcement means includes a transistor for precharging the first bit line pair to the precharge voltage level provided from the precharge voltage applying terminal.

11. The memory device as recited in claim 10, wherein the transistor is an NMOS transistor.

12. The memory device as recited in claim 7, wherein the first control block includes:

a sense amplifier for sensing data stored in the memory cells of the first cell array block through the first bit line pair;

a precharge unit, coupled between the sense amplifier and an end portion of the first bit line pair, for precharging the first bit line pair to a predetermined level in response to a bit line precharge control signal;

a cell array block selection unit for controlling a connection between the first cell array block and the sense amplifier in response to a bit line isolation signal; and an equalization unit, coupled between the cell array block selection unit and the first cell array block, for equalizing the first bit line pair in response to a bit line equalization signal.

13. The memory device as recited in claim 7, wherein the second control block includes:

a sense amplifier for sensing data stored in the memory cells of the second cell array block through the second bit line pair commonly coupled to the first cell array block and the second cell array block;

a precharge unit, coupled between the sense amplifier and the first cell array block, for precharging the second bit line pair to a predetermined level in response to a bit line precharge control signal;

a first cell array block selection unit for controlling a connection between the first cell array block and the sense amplifier in response to a first bit line isolation signal;

a second cell array block selection unit, coupled between the first cell array block selection unit and the first cell array block, for equalizing the second bit line pair in response to a first bit line equalization signal; and a second equalization unit, coupled between the second cell array block selection unit and the second cell array block, for equalizing the second bit line pair in response to a second bit line equalization signal.

* * * * *